US008122304B2

(12) United States Patent
Fujiwara et al.

(10) Patent No.: US 8,122,304 B2
(45) Date of Patent: *Feb. 21, 2012

(54) JTAG CONTROLLED SELF-REPAIR AFTER PACKAGING

(75) Inventors: Yoshinori Fujiwara, Tsukuba (JP); Masayoshi Nomura, Ryugasaki (JP)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/906,764

(22) Filed: Oct. 18, 2010

(65) Prior Publication Data

US 2011/0035635 A1 Feb. 10, 2011

Related U.S. Application Data

(63) Continuation of application No. 12/764,810, filed on Apr. 21, 2010, now Pat. No. 7,831,870, which is a continuation of application No. 11/789,367, filed on Apr. 23, 2007, now Pat. No. 7,721,163.

(51) Int. Cl.
*G11C 29/00* (2006.01)
*G01R 31/28* (2006.01)
*G11C 17/18* (2006.01)

(52) U.S. Cl. ........ 714/710; 714/711; 714/718; 714/726; 714/727; 365/201; 365/225.7

(58) Field of Classification Search .................. 714/710, 714/711, 718, 726, 727; 365/201, 225.7
See application file for complete search history.

(56) References Cited

U.S. PATENT DOCUMENTS

| 5,325,368 | A | 6/1994 | James et al. ................. 714/727 |
| 5,377,146 | A | 12/1994 | Reddy et al. .................. 365/200 |
| 6,243,842 | B1 | 6/2001 | Slezak et al. .................. 714/724 |
| 6,300,769 | B1 | 10/2001 | Phan ............................ 324/537 |
| 6,430,100 | B2 | 8/2002 | Kim ........................... 365/225.7 |
| 6,439,046 | B1 | 8/2002 | Kruspe et al. ............... 73/152.01 |
| 6,445,627 | B1 | 9/2002 | Nakahara et al. ............. 365/200 |
| 6,462,684 | B1 | 10/2002 | Medelius et al. ............. 341/120 |
| 6,505,313 | B1 | 1/2003 | Phan et al. .................... 714/718 |
| 6,560,740 | B1 | 5/2003 | Zuraski, Jr. et al. .......... 714/733 |
| 6,675,334 | B2 | 1/2004 | Wadley ......................... 714/727 |
| 6,771,549 | B1 | 8/2004 | Konuk et al. ................. 365/200 |
| 6,871,297 | B2 | 3/2005 | Puri et al. ........................ 714/30 |
| 6,898,143 | B2 | 5/2005 | Puri et al. .................... 365/225.7 |
| 6,928,598 | B1 | 8/2005 | Agrawal et al. ............... 714/726 |

(Continued)

FOREIGN PATENT DOCUMENTS

KR 10-2000-0038417 7/2000

OTHER PUBLICATIONS

International Search Report and Written Opinion in International Application No. PCT/US2008/061037 dated Aug. 14, 2008.

*Primary Examiner* — John J Tabone, Jr.

(74) *Attorney, Agent, or Firm* — Dorsey & Whitney LLP

(57) ABSTRACT

An integrated circuit containing memory includes IEEE 1149.1 (JTAG) controlled self-repair system that permits permanent repair of the memory after the integrated circuit has been packaged. The JTAG controlled self-repair system allows a user to direct circuitry to blow fuses using an externally supplied voltage to electrically couple or isolate components to permanently repair a memory location with JTAG standard TMS and TCK signals. The system may optionally sequentially repair more than one memory location using a repair sequencer.

19 Claims, 4 Drawing Sheets

U.S. PATENT DOCUMENTS

| | | | |
|---|---|---|---|
| 6,940,765 B2 | 9/2005 | Kyung | 365/200 |
| 6,940,766 B2 | 9/2005 | Konuk et al. | 365/200 |
| 7,007,211 B1 | 2/2006 | White et al. | 714/718 |
| 7,076,699 B1 | 7/2006 | Puri et al. | 714/710 |
| 7,088,627 B1 | 8/2006 | Bajwa et al. | 365/200 |
| 7,127,647 B1 | 10/2006 | Zorian et al. | 714/711 |
| 7,149,921 B1 | 12/2006 | Zorian et al. | 714/6 |
| 7,149,924 B1 | 12/2006 | Zorian et al. | 714/30 |
| 7,174,486 B2 | 2/2007 | Adams et al. | 714/710 |
| 7,185,243 B1 | 2/2007 | Puri et al. | 714/718 |
| 7,251,756 B2 | 7/2007 | Anand et al. | 714/710 |
| 7,529,996 B2 | 5/2009 | Whetsel | 714/731 |
| 7,721,163 B2 | 5/2010 | Fujiwara et al. | 714/710 |
| 7,831,870 B2 | 11/2010 | Fujiwara et al. | 714/710 |
| 2003/0146454 A1 | 8/2003 | Sasaki et al. | 257/208 |
| 2007/0047343 A1 | 3/2007 | Adams et al. | 365/200 |
| 2008/0209283 A1 | 8/2008 | Gupta et al. | 714/718 |
| 2008/0263392 A1 | 10/2008 | Fujiwara et al. | 714/5 |
| 2010/0205489 A1 | 8/2010 | Fujiwara et al. | 714/710 |

JTAG CONTROLLED SELF-REPAIR AFTER PACKAGING

CROSS-REFERENCE TO RELATED APPLICATION

This application is a continuation of U.S. patent application Ser. No. 12/764,810, filed Apr. 21, 2010, and issued as U.S. Pat. No. 7,831,870 B2 on Nov. 9, 2010, which application is a continuation of U.S. patent application Ser. No. 11/789,367, filed Apr. 23, 2007 and issued as U.S. Pat. No. 7,721,163 B2 on May 18, 2010. These applications and patents are incorporated by reference herein, in their entirety, and for any purpose.

TECHNICAL FIELD

Embodiments of this invention relate to self-repair of memories, and, more particularly, to IEEE 1149.1 (JTAG) controlled self-repair after packaging.

BACKGROUND OF THE INVENTION

Fabrication of semiconductor memory devices and other semiconductor devices containing memory is an imperfect process. The imperfections in the fabrication process lead inevitably to imperfections in the semiconductor devices themselves. Such imperfections might manifest themselves as, for example, semiconductor crystalinity defects or electrical connector discontinuities. Naturally, such imperfections in the semiconductor devices can lead to errors in storing and retrieving data from memory cells contained within such semiconductor devices. For this reason, it is necessary to test each and every memory cell on a semiconductor device after fabrication and prior to selling such devices to manufacturers and other end users for use in electronic systems.

Semiconductor and memory device testing was originally only intended to identify faulty devices which were then discarded. As memory cell density has increased, however, the failure rates of devices containing memory cells can become intolerably large leading to too many devices being discarded. In an effort to improve device yields, methods for repairing defective devices have been developed. More specifically, semiconductor devices with repairable memory typically include redundant rows or columns of memory cells. During testing of such devices, the addresses of the faulty rows, columns or cells are identified and the addresses saved. These faulty memory rows, columns or cells are then effectively replaced by one of the redundant rows, columns. This is typically accomplished through the use of fuses or anti-fuses (hereinafter referred to collectively as 'fuses') which are used to create open and closed circuit paths within the memory or its associated decoders. Through the use of a laser, an appropriate combination of fuses can be "blown" thereby electrically isolating defective cells while electrically connecting the redundant cells in their place.

Most typically, both the testing and repair of semiconductor devices has been accomplished through the use of complex test equipment that is physically connected to each memory die. Moreover, it is not uncommon that testing of the devices is done on one piece of equipment and the repair on another. Obviously, testing, repairing and then retesting of the repaired devices takes a great deal of time when the devices have to be moved from one machine to another. To help mitigate this problem, test and repair circuitry can be built into the semiconductor device itself. Built-in self test (BIST) and built-in self repair (BISR) capabilities within semiconductor devices containing memory can increase device yields in a time efficient manner.

Validation and repair of prior art semiconductor devices using BIST and BISR still generally requires the use of a test machine. The test machine is used to electrically interface with a device die. Once the test machine is connected, the machine is used to issue a test mode command to the die. This mode is used to enable the BIST circuitry to run test patterns against the memory cells and other circuitry. When a test failure occurs, the BIST circuitry in the device captures the address of any memory failures. Once the address or addresses have been captured, the test machine issues may be used to control and direct the repair with, for example, a laser repair machine. After repair is complete, the test machine is typically used to run the test patterns again to ensure the repair was completed properly and otherwise verify the integrity of the device.

An example of a prior art repair system is illustrated in FIG. 1. A die 100 includes a memory array 140, row and column decoders 120, redundant row and column decoders 125 and a control module 110. The integrated circuit die 100 may optionally contain other logic or an application specific integrated circuit (ASIC) 145. As was described above, a Test and Repair Machine 105 interfaces directly with the integrated circuit die 100. The Test and Repair Machine 105 may, for example, run tests on the memory array 140 and related circuitry. A typical test might write data to the memory array 140 and then later read the data. A test comparator 130 would then compare the read data with the data that was written to determine if there has been an error. If so, an error flag is generated and routed to the control module 210. The error flag may be used by the control module 210 for storing the failure address within the control module 210 or elsewhere on the device. Alternatively, the error flag may be routed directly to the test and repair machine 105 and the machine 105 can store the failure address. The failure address, whether stored internally or externally, may be used to program a fuse bank in the redundant row and column decoders 125 with, for example, an external laser repair machine as was discussed above. Once the appropriate fuses have been programmed, the redundant row and column decoders 125 are able to replace a received address of the faulty memory cells with an address of redundant cells in the memory array 140.

Although this process of validation and repair has increased chip yields and testing efficiency, it is not without certain drawbacks. Most notably, the prior art repair circuitry may only be accessed at the die level by a test machine. That is, once the die has been packaged into, for example, a single inline package (SIP), the repair circuitry (e.g. a fuse) is no longer easily accessible and further repairs to the memory are not easily made. Semiconductor devices containing memory may, however, develop further faults during the packaging process or in subsequent use. The current technology does not allow for the packaged devices to be easily repaired. Memory manufacturers and customers who use the final packaged devices cannot, therefore, easily repair memory within these faulty devices. If such failures could easily be repaired after sale, customer yield would be desirably improved.

There is therefore a need for a system for accessing and controlling the repair circuitry of semiconductor devices containing memory after the devices have been packaged.

DETAILED DESCRIPTION OF THE INVENTION

Figure 1:
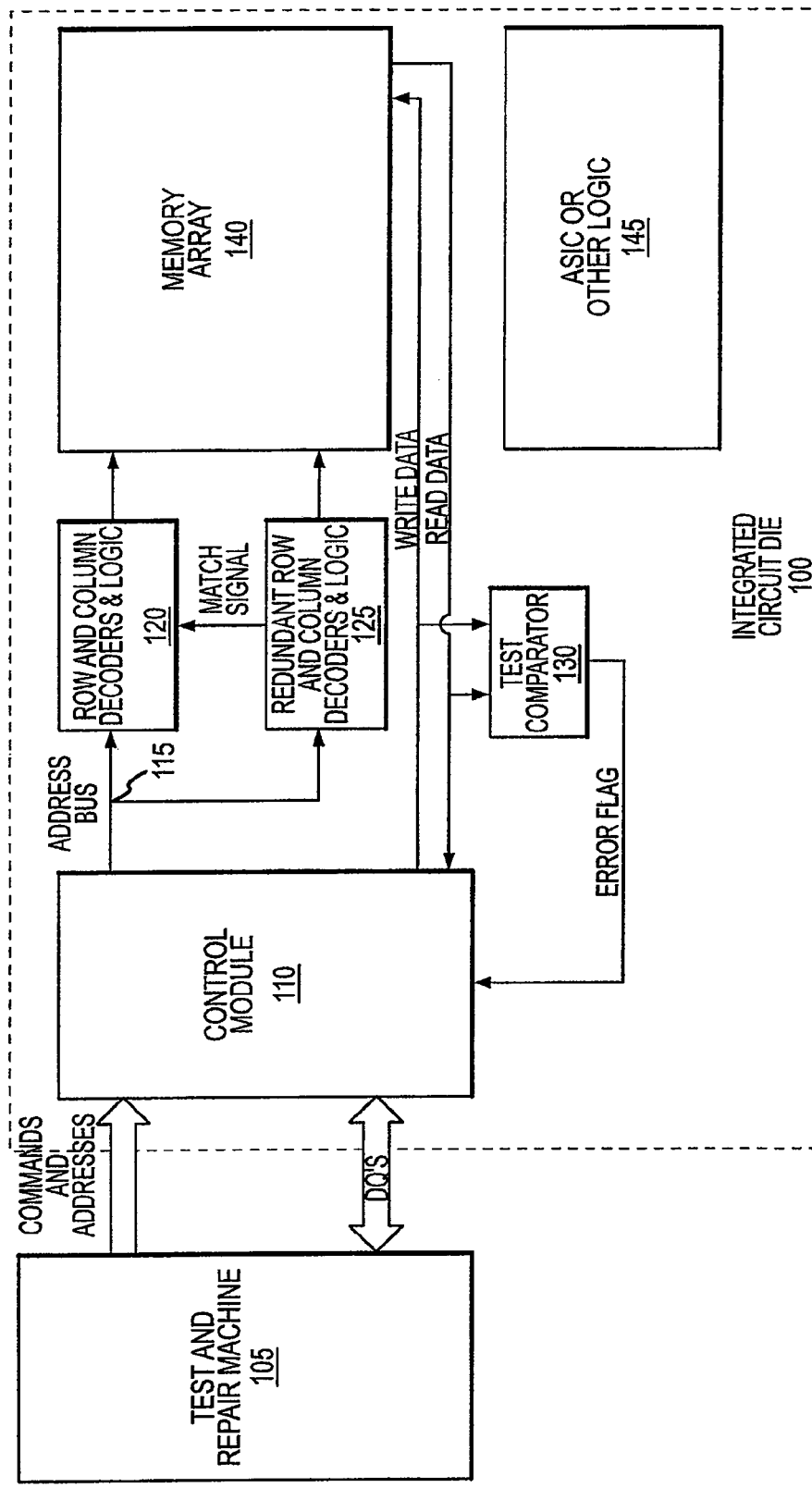
FIG. 1 is a functional block diagram depicting a prior art method of testing and repairing a semiconductor device containing memory.
Figure 2:
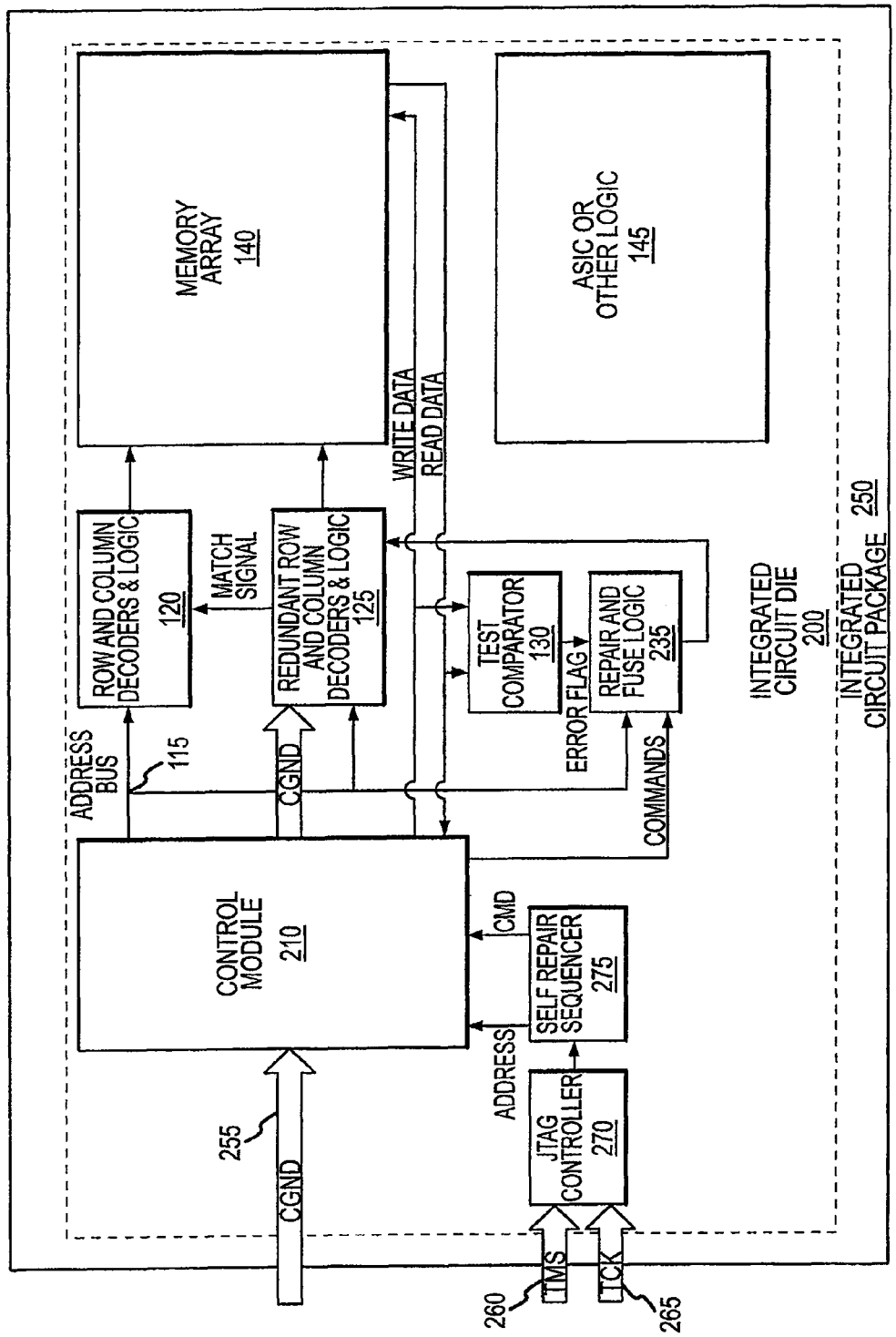
FIG. 2 is a functional block diagram of a JTAG controlled self-repair system according to an embodiment of the invention.

FIG. 2 depicts a JTAG controlled self-repair system according to one embodiment of the invention. As shown in FIG. 2, the system includes an integrated circuit die 200 that has been packaged into an integrated circuit package 250. As was discussed above, the die 200 is no longer exposed to or usable with a memory tester, laser repair machine or logic tester. Instead, the integrated circuit die 200 includes circuitry for making a permanent and non-volatile repair of a memory array 140 on the integrated circuit die 200 that is contained within the integrated circuit package 250. In particular, the JTAG controlled self-repair system includes a JTAG controller 270 and self-repair sequencer 275. The JTAG controller 270 receives clock and command signals from the IEEE 1149.1 (JTAG) standard TCK 265 and TMS 260 pins, respectively, that are external to the integrated circuit package 250. As is well known in the art, the TMS 260 pin is used to manipulate a JTAG Test Access Port (TAP) state machine. The TAP controller state machine is contained within the JTAG controller 270. The TMS 260 pin is used to step through the JTAG state-machine and, as will be discussed in more detail below, the self-repair sequencer 275 generates addresses and commands that are directed to a control module 210. The JTAG controlled self-repair system of FIG. 2 also includes an CGND 255 pin. The CGND 255 pin can be coupled to an external high-voltage supply. The voltage of this supply is greater than the operating voltage of the integrated circuit and is used to blow fuses or that create a non-volatile and permanent repair of the memory array 140.

A typical test and repair sequence using embodiments of the invention will now be described. Prior to initiating the repair sequence, the chip must be tested to locate faulty memory locations. As is known by those of ordinary skill, and as explained above, methods exist for testing an integrated circuit using built-in self test circuits (not described here). Using suitable built-in self test circuitry, the control module 210 causes data to be written to the memory array 140. When the data is subsequently read from the memory array 140, the test comparator 130 compares the read data with the expected data. If the read data and expected data do not match and error flag is generated which causes the failure address to be captured and stored within repair and fuse logic 235. Alternatively, the error flag might be used to capture or store the failure address elsewhere on the chip. Once all locations in the memory array have been tested and all failure addresses have been stored in the chip, JTAG controlled self-repair can begin.

Figure 3:
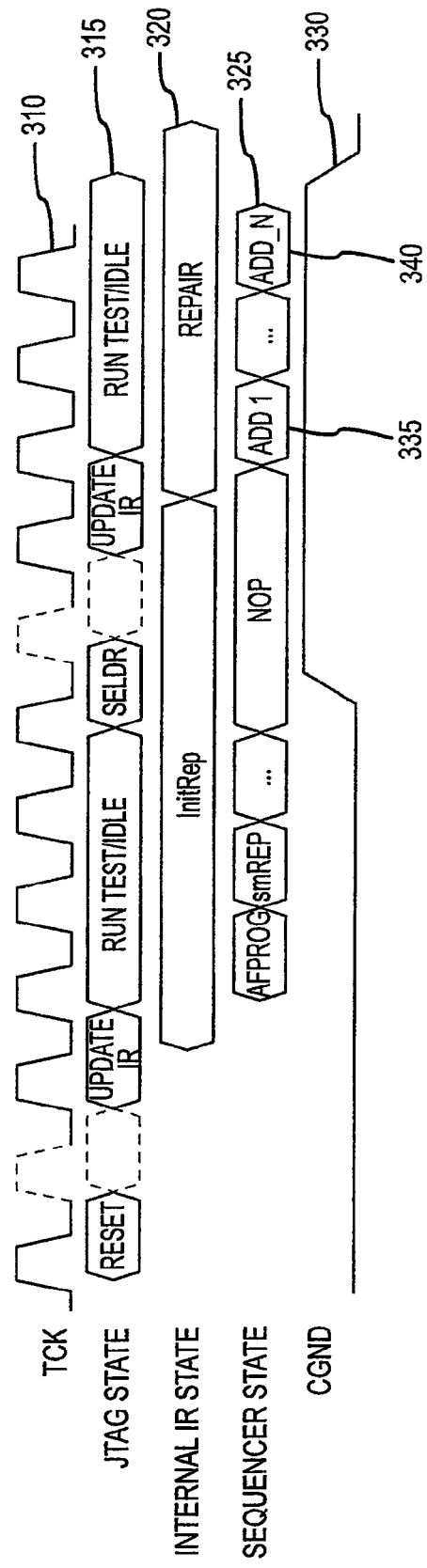
FIG. 3 is a JTAG controlled self-repair signal timing diagram illustrating the JTAG, internal command and CGND signal timing in the system of FIG. 2.

FIG. 3 depicts a JTAG controlled self-repair signal timing diagram illustrating the JTAG, internal command and CGND signal timing according to an embodiment of the invention. With further reference to FIG. 2, the self-repair sequencer 275 accepts signals from the JTAG controller 270 and generates internal repair commands and addresses. In one embodiment, the JTAG controller 270 can also generate column and row address strobe (CAS and RAS) signals (not shown). Alternatively, the control module 210 may accept commands generated by the self-repair sequencer 275 and generate the CAS and RAS signals itself. The JTAG controller 270 of FIG. 2 accepts the TCK signal 310 of FIG. 3 on the external TCK 265 pin. As is understood by one of ordinary skill, through properly timed applications of a TMS signal on the TMS 260 pin as shown in FIG. 2, the internal state of the JTAG controller 270 can be manipulated so as to create the JTAG state 315 as shown in FIG. 3. The JTAG controller 270 issues an initialize repair command to the self-repair sequencer 275 when the JTAG state machine transitions to the 'update IR' state as is reflected by an internal IR state 320 of FIG. 3.

After the JTAG controller 270 issues the initialize repair command to enter an initialize repair mode, the self-repair sequencer 275 state enters Afprog and then smREP as shown by a sequencer state 325 signal of FIG. 3. The Afprog state enables the fuse programming logic in the repair and fuse logic 235. Likewise, the smREP state enables the repair and fuse logic 235 to automatically map redundant circuitry and select appropriate fuses to blow. At this point, the repair and fuse logic 235 selects fuse bank addresses that map the redundant row and column decoders. After the repair and fuse logic 235 has loaded the fuse bank address, the user brings the high voltage CGND signal 330 high and forces the chip to enter a repair mode.

The repair mode is entered by stepping through the JTAG step machine a second time as reflected by the JTAG state 315. Just as before, when the state machine within the JTAG controller 270 enters 'update IR', the internal IR state 320 transitions to Repair mode. While in the Repair mode, the self-repair sequencer 275 steps through each repair address that was stored during testing, Add_1 335 through Add_n 340 as needed, and issues commands that cause the repair and fuse logic 235 to blow the appropriate fuses in the fuse bank. Once all the fuses have been blown, the user brings the CGND signal 330 low and repair is complete.

The repair of the memory array is non-volatile and permanent once the fuses have been blown. After repair, the memory array 140 continues to be accessed by the ASIC or other logic 145 in the normal manner. That is, memory addresses are generated by the control module 210 which are conveyed by the address bus 115 to the row and column decoders 120. The addresses are likewise conveyed to the redundant row and column decoders and logic 125. The redundant row and column decoders and logic 125 compare the address provided on the address bus with the stored failure addresses, which is received from the repair and fuse logic 235. If there is a match, the match signal 280 is asserted which prevents the row and column decoders 120 from activating. Instead, the redundant row and column decoders 125 are activated thereby re-routing access to the redundant memory cells in the memory array 140 instead of to the faulty memory cells. Such means of repair is advantageous because the repair process must be run only one time which, as will be understood by one of ordinary skill, provides a significant power savings and likewise can be accomplished after the semiconductor devices have been packaged.

Figure 4:
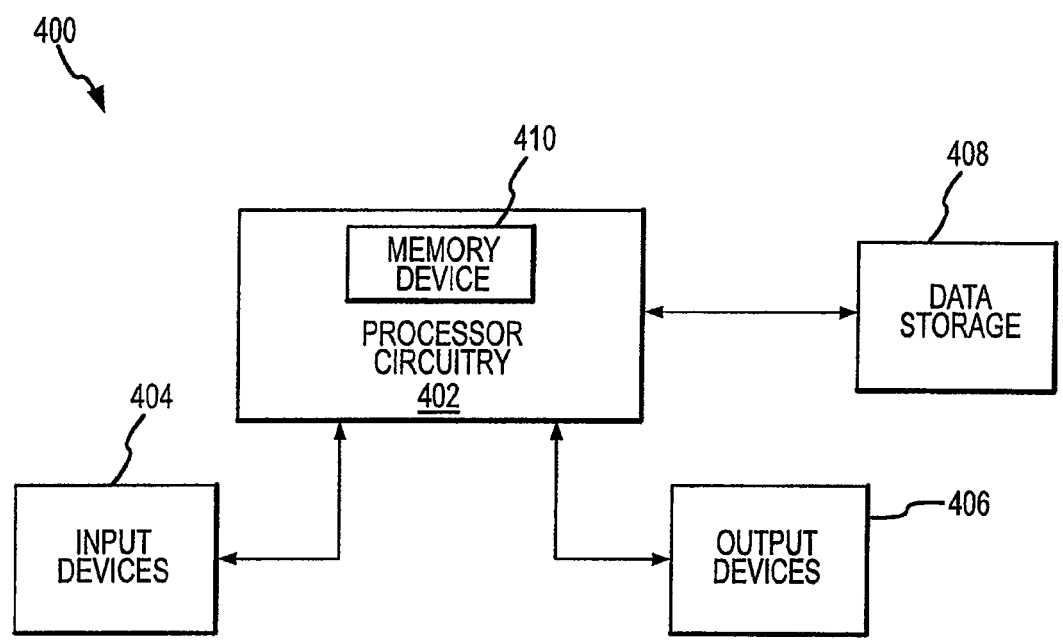
FIG. 4 is a simplified block diagram of a processor-based system according to an embodiment of the invention including the memory device containing the JTAG controlled self-repair system of FIG. 2.

FIG. 4 is a block diagram of a processor-based system 400 including processor circuitry 402 having a memory device 410. The processor circuitry 402 is coupled through address, data, and control buses to the memory device 410 to provide for writing data to and reading data from the memory device 410. The processor circuitry 402 includes circuitry for performing various processing functions, such as executing specific software to perform specific calculations or tasks. The processor-based system 400 also includes one or more input devices 404 coupled to the processor circuitry 402 to allow an operator to interface with the processor-based system 400.

Examples of input devices 404 include keypads, touch screens, and scroll wheels. The processor-based system 400 also includes one or more output devices 406 coupled to the processor circuitry 402 to provide output information to the operator. In one example, the output device 406 is a visual display providing visual information to the operator. Data storage 408 is also coupled to the processor circuitry 402 to store data that is to be retained even when power is not supplied to the processor-based system 400 or to the data storage 408. The memory device 410 contains an embodiment of the JTAG controlled self-repair system of FIG. 2, or some other embodiment of the invention, and the processor-based system 400 may direct the repair of the memory device 410 either with or without operator intervention and assistance.

From the foregoing it will be appreciated that, although specific embodiments of the invention have been described herein for purposes of illustration, it will be understood by one skilled in the art that various modifications may be made without deviating from the invention. Accordingly, the invention is not limited except as by the appended claims.

What is claimed is:

1. A memory repair system, comprising:
   an integrated circuit configured to receive at least a test mode select signal and, a test clock signal, the integrated circuit comprising:
   a plurality of memory cells;
   circuit elements coupled to programmable elements and configured to enable programming of the programmable elements; and
   a test access port controller configured to generate at least one internal repair command responsive to the test mode select signal and the test clock signal, the at least one internal repair command configured to program at least one of the programmable elements to re-route an address for at least one memory address to another memory address.

2. The memory repair system of claim 1 wherein the test access port controller is configured to receive the test mode select signal and the test clock signal from an external source.

3. The memory repair system of claim 1 wherein the circuit elements are configured to enable programming of fuses responsive to a programming signal being asserted.

4. The memory repair system of claim 1 wherein the test access port controller is configured to receive the test mode select signal and the test clock signal through an IEEE 1149.1 (JTAG) compliant connection.

5. The memory repair system of claim 1 wherein the test access port controller is configured to generate the at least one internal repair command causing programming of programmable elements to re-route an address for at least one memory address to redundant memory to repair the at least one memory location.

6. A memory, comprising:
   a plurality of memory cells operable to store data;
   a row and column circuit operable to receive and decode row and column address signals applied to the circuit and further operable to access the plurality of memory cells;
   a test access port controller configured to generate at least one internal repair command responsive to an external test mode select signal and an external test clock signal applied to the memory; and
   a control module configured to re-route access to memory cells for at least one memory location responsive to the at least one internal repair command to permanently repair the memory location.

7. The memory of claim 6 wherein the control module is configured to re-route access to memory cells for at least one memory location by programming programmable elements.

8. The memory of claim 6 wherein the plurality of memory cells comprises redundant memory cells to which access to defective memory cells is re-routed.

9. The memory of claim 6, further comprising:
   self test circuitry configured to test the plurality of memory cells responsive to the external test mode select signal and the external test clock signal applied to memory and determine defective memory locations, the self test circuitry further configured to store memory addresses for the defective memory locations.

10. The memory of claim 6, further comprising a repair sequencer coupled to the test access port controller and the control module and configured to sequentially re-route access for multiple memory locations to memory cells by causing the control module to program at least some of the programmable elements of the row and column circuit responsive to the at least one internal repair command.

11. The memory of claim 6 wherein the test access port controller is configured to receive the test mode select signal and the test clock signal in accordance with an IEEE 1149.1 (JTAG) standard.

12. A method for repairing memory, comprising:
    coupling external test mode select and test clock signals to the memory;
    generating an internal repair command in the integrated circuit responsive to the test mode select signal and the test clock signal;
    repairing a memory location within the memory by programming programmable elements responsive to the internal repair command to re-route access to the memory location to an alternate memory location.

13. The method of claim 12 wherein generating an internal repair command in the integrated circuit comprises:
    issuing an initialize repair command responsive to transitioning to an internal repair state; and
    entering a repair mode responsive to stepping through for a second time to the internal repair state.

14. The method of claim 12 wherein repairing a memory location comprises:
    stepping through at least one repair address; and
    issuing commands to cause appropriate fuses to be blown to re-route access to memory.

15. The method of claim 12, wherein generating an internal repair command comprises:
    initializing a self-repair mode responsive to the test mode select signal and the test clock signal;
    entering the self-repair mode;
    stepping through repair addresses corresponding to memory locations to be repaired; and
    issuing the internal repair command for programming programmable elements to map a repair address to memory.

16. The method of claim 15 wherein initializing a self-repair mode comprises:
    enabling fuse programming logic; and
    mapping circuitry and selecting programmable elements to program.

17. The method of claim 15, further comprising:
    exiting the self-repair mode after programming the programmable elements to map the repair addresses to memory.

18. The method of claim 15 wherein entering the self-repair mode comprises entering a same state as for initializing the self-repair mode for a second time.

19. The method of claim 12, further comprising:

testing a plurality of memory locations responsive to the test mode select signal and the test clock signal to determine defective memory locations;

storing memory addresses for the defective memory locations to be used for repairing the defective memory locations.

\* \* \* \* \*